United States Patent
Tabatabaei

(10) Patent No.: US 6,762,703 B1
(45) Date of Patent: *Jul. 13, 2004

(54) SIGMA DELTA MODULATOR

(75) Inventor: Ali Tabatabaei, Sunnyvale, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/236,008

(22) Filed: Sep. 4, 2002

(51) Int. Cl.[7] ................................................ H03M 3/00
(52) U.S. Cl. ....................................... 341/143; 341/155
(58) Field of Search ............................. 341/143, 155, 341/120

(56) References Cited

U.S. PATENT DOCUMENTS

| | | | | |
|---|---|---|---|---|
| 5,181,032 A | * | 1/1993 | Ribner | 341/143 |
| 5,283,578 A | * | 2/1994 | Ribner et al. | 341/143 |
| 5,442,353 A | * | 8/1995 | Jackson | 341/143 |
| 5,719,573 A | * | 2/1998 | Leung et al. | 341/143 |
| 5,736,950 A | * | 4/1998 | Harris et al. | 341/143 |
| 5,760,722 A | * | 6/1998 | Harris et al. | 341/143 |
| 5,982,315 A | * | 11/1999 | Bazarjani et al. | 341/143 |
| 6,061,008 A | * | 5/2000 | Abbey | 341/143 |
| 6,111,531 A | * | 8/2000 | Farag | 341/143 |
| 6,121,910 A | * | 9/2000 | Khoury et al. | 341/143 |
| 6,160,505 A | * | 12/2000 | Vaishampayan | 341/143 |
| 6,259,389 B1 | * | 7/2001 | McGrath | 341/120 |
| 6,515,605 B2 | * | 2/2003 | Panasik et al. | 341/143 |
| 6,538,588 B1 | * | 3/2003 | Bazarjani | 341/143 |

OTHER PUBLICATIONS

Tabatabaei, Ali and Wooley, Bruce A., "A Two–Path Bandpass Sigma–Delta Modulator with Extended Noise Shaping", IEEE Journal of Solid–State Circuits, vol. 35, No. 12, Dec. 2000.

* cited by examiner

Primary Examiner—Jean Bruner Jeanglaude
(74) Attorney, Agent, or Firm—Van Pelt & Yi LLP

(57) ABSTRACT

A system and method are disclosed for providing noise reduction in a sigma delta modulator. Reducing the noise comprises inputting a signal to a plurality of modulator stages; feeding back the signal within at least one of the modulator stages through a feedback loop having a gain wherein the feedback loop provides noise shaping.

28 Claims, 4 Drawing Sheets

SIGMA DELTA MODULATOR

FIELD OF THE INVENTION

The present invention relates generally to sigma delta modulators. More specifically, a sigma delta modulator with noise shaping is disclosed.

BACKGROUND OF THE INVENTION

Analog to digital converters (ADCs) are widely used in electronic systems for digitizing signals. The conversion from analog signal to digital introduces noise into a system, referred to as quantization noise resulting from the quantization process. FIG. 1A shows the noise transfer function (NTF) of a Nyquist ADC. A Nyquist ADC is one type of ADC that samples the input signal at twice the bandwidth, which is a sampling rate adequate for recovering the original signal according to the Nyquist theorem. The NTF of the Nyquist SDM tends to be relatively flat, and does not reduce the noise.

Attempts have been made to ameliorate the noise problem using oversampled ADCs, also known as sigma delta modulators (SDMs), to provide noise shaping. FIG. 1B illustrates the noise transfer function of a sigma delta modulator. The input signal is sampled at a rate greater than twice the bandwidth. The NTF of the SDM has a minimum centered at direct current (DC) that forms a notch in the signal spectrum. The presence of this notch in the NTF provides noise shaping. Thus, the output noise is reduced at frequencies around the notch.

The benefits of an oversampled SDM generally come from the use of a large oversampling ratio. As the oversampling ratio decreases, the dynamic range of the SDM decreases. To meet certain dynamic range requirements, some designs use multiple cascaded stages to achieve a lower oversampling ratio. FIG. 1C illustrates the noise transfer function of a cascaded sigma delta modulator. With multiple cascaded stages, the notch in the NTF deepens at DC, and provides further noise reduction at frequencies around DC. However, the improvement in noise reduction due to each stage diminishes as more stages are cascaded.

For sigma delta modulators used in wide band applications such as wireless local area network devices, it is desirable to reduce noise for a broader frequency range. In "A TWO-PATH BANDPASS SIGMA-DELTA MODULATOR WITH EXTENDED NOISE SHAPING" by Tabatabaei, et al. (IEEE JOURNAL OF SOLID-STATE CIRCUITS, VOL. 35, NO. 12, DECEMBER 2000) which is incorporated by reference, Tabatabaei discloses a way to produce minima in the NTF at frequencies other than DC, by digitally mixing the output of one stage with another frequency. FIG. 1D illustrates the noise transfer function of a two stage sigma delta modulator that uses digital mixing, according to Tabatabaei. The cascaded stage produces a minimum in its transfer function that is offset from DC. As a result, in the NTF, there is an additional notch centered at $f_0$ besides the one at DC. The NTF is shaped to reduce noise near both notches. This design is superior to the conventional cascaded SDM in terms of noise characteristics, but a number of problems remain. The digital mixer adds complexity to the circuitry and consumes more power. The mixer frequency is dependent on the system clock and may only take on a limited number of values. Also, the mixer is designed to output a single frequency, therefore the location of the additional minimum cannot be easily moved.

It is desirable to have a wide band SDM that has broader noise reduction without increasing circuitry complexity and power consumption. It would also be useful to control the location of the minimum in the NTF more easily.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved oversampled sigma delta modulator (SDM) design is disclosed. The design employs multiple cascaded modulator stages with feedback to achieve noise reduction over a wide frequency band. In one embodiment, the SDM comprises two modulator stages and an error cancellation processor. In one embodiment, the later stages have higher level quantizers than the first stage.

Figure 1:
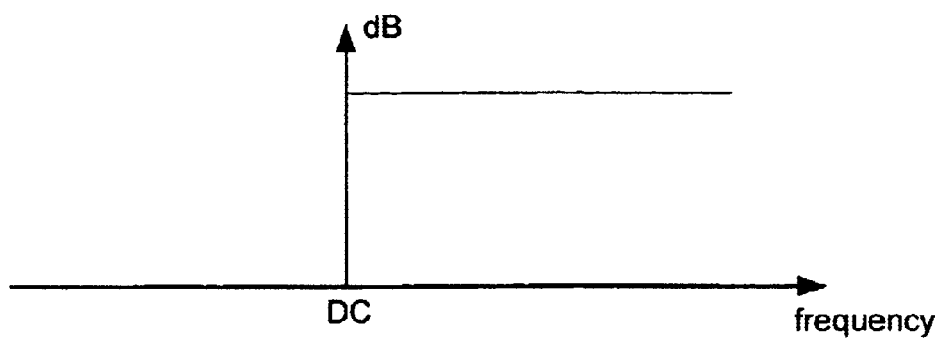
FIG. 1A shows the noise transfer function of a Nyquist ADC.
FIG. 1B illustrates the noise transfer function of a sigma delta modulator.
FIG. 1C illustrates the noise transfer function of a cascaded sigma delta modulator.
FIG. 1D illustrates the noise transfer function of a two stage sigma delta modulator that uses digital mixing.
Figure 1:
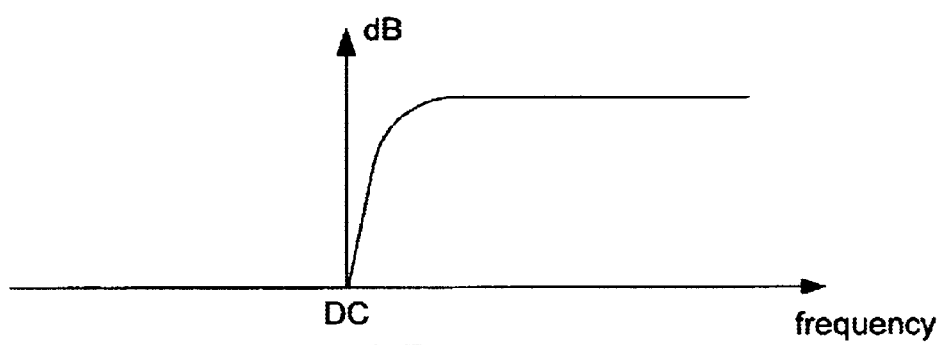
Figure 1:
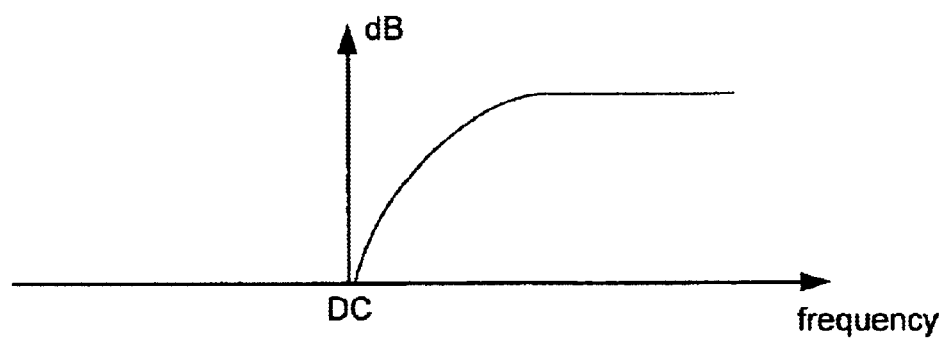
Figure 1:
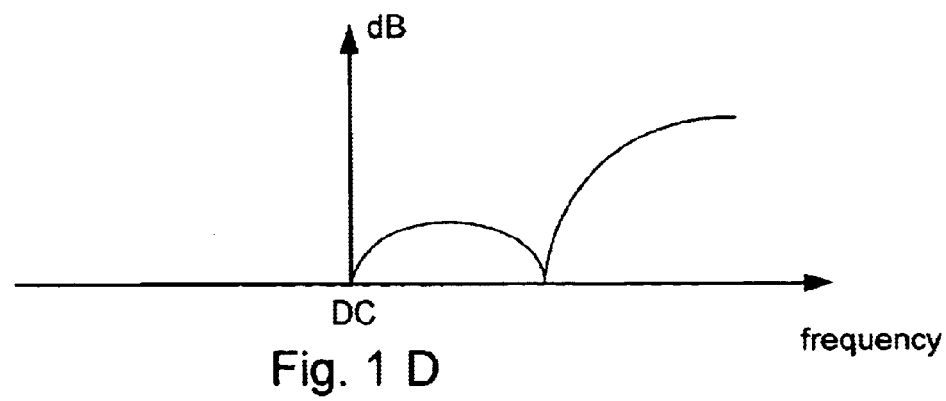
Figure 2:
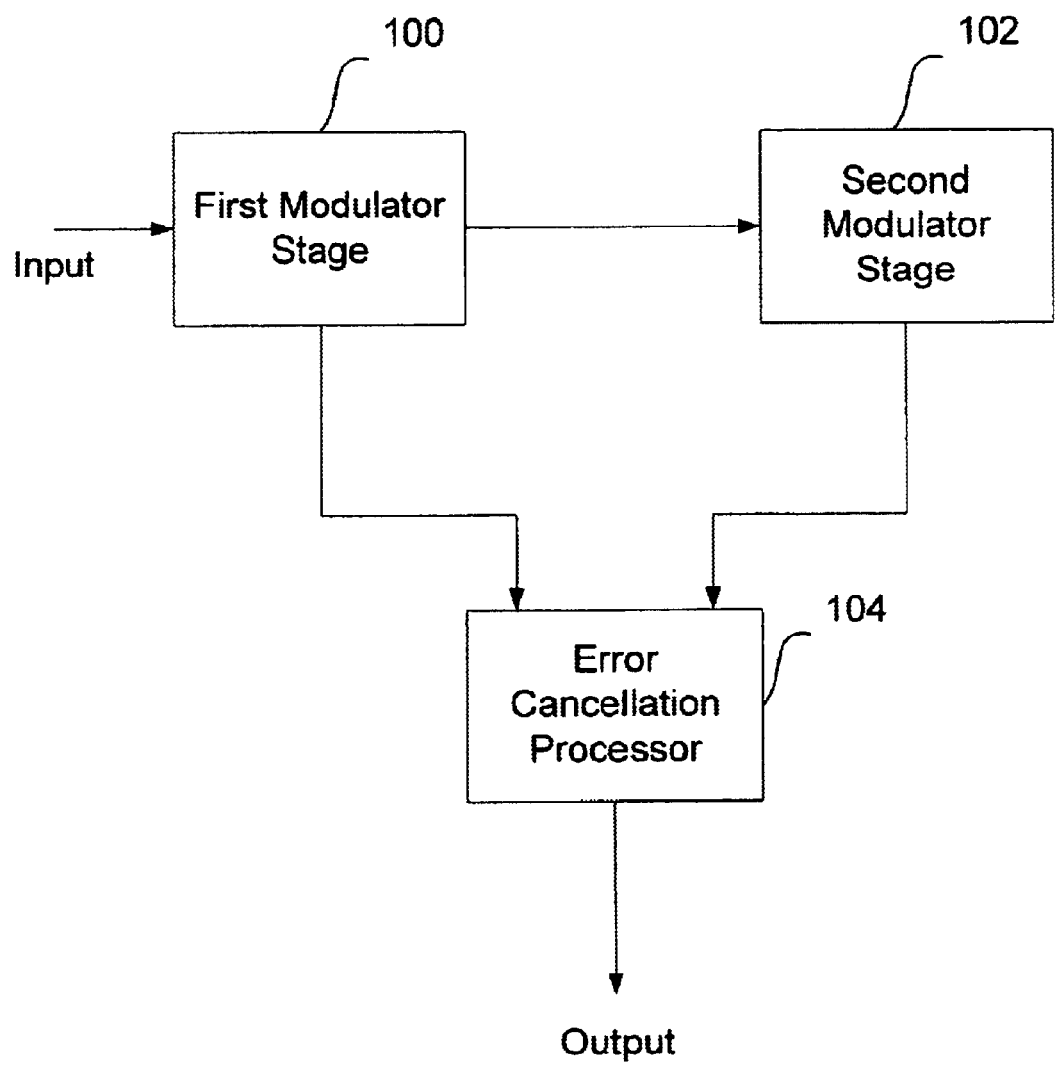
FIG. 2 is a block diagram illustrating one embodiment of a sigma delta modulator.

FIG. 2 is a block diagram illustrating one embodiment of a sigma delta modulator. In this embodiment, the SDM includes two stages in a cascaded configuration. Block 100 is the first modulator stage and block 102 is the second modulator stage. The output from the first modulator stage is fed to the second modulator stage as input. Block 104 is an error cancellation processor that corrects system errors based on the outputs from the first and the second stage.

Figure 3:
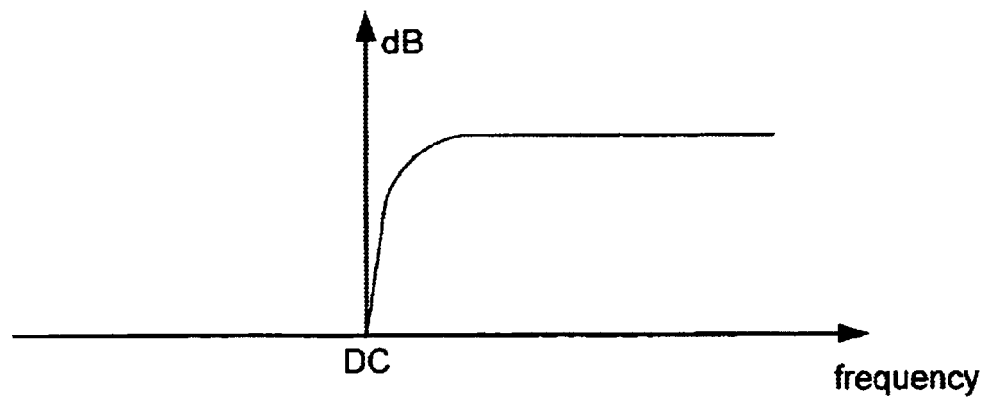
FIG. 3A illustrates the noise transfer function of the first modulator stage as shown in FIG. 2.
FIG. 3B illustrates the noise transfer function of the second modulator stage as shown in FIG. 2.
FIG. 3C illustrates the noise transfer function of a sigma delta modulator as shown in FIG. 2.
Figure 3:
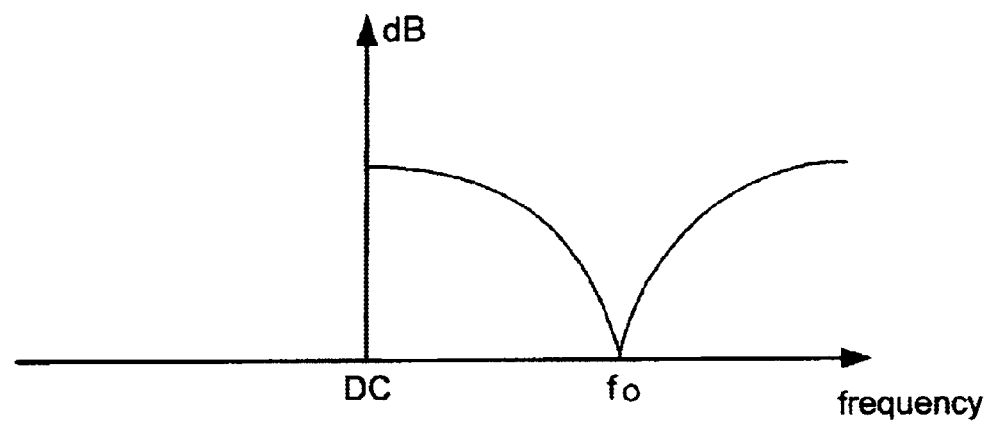
Figure 3:
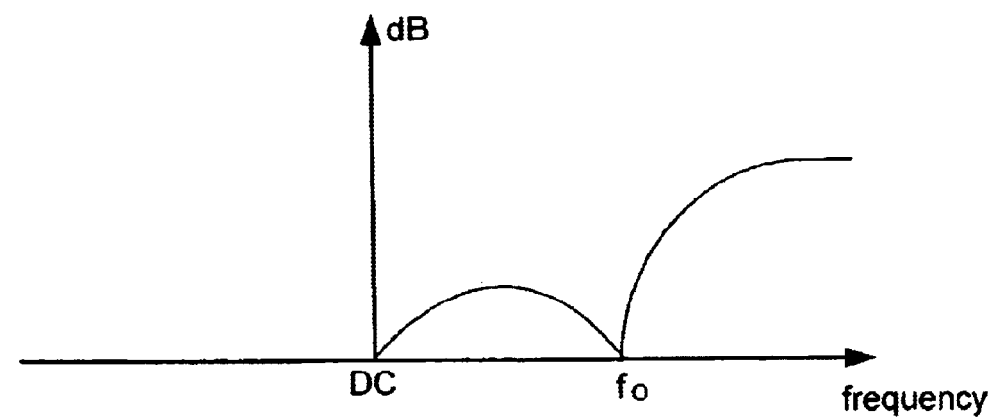

FIG. 3A illustrates the noise transfer function of the first modulator stage as shown in FIG. 2. The NTF of the first modulator stage has a minimum centered at DC. The modulator reduces noise signal at low frequencies, and is known as a "lowpass" modulator.

FIG. 3B illustrates the noise transfer function of the second modulator stage as shown in FIG. 2. The NTF of the second modulator stage has a minimum that is offset from DC, at $f_0$. The NTF of the second modulator reduces noise signal within a frequency band that is around $f_0$, and the modulator is known as a "bandpass" modulator.

FIG. 3C illustrates the noise transfer function of a sigma delta modulator as shown in FIG. 2. By cascading the two stages, the overall NTF for the modulator includes one minimum centered at DC, and another minimum that is offset from DC at $f_0$. The modulator's noise is reduced near DC as well as near $f_0$.

Figure 4:
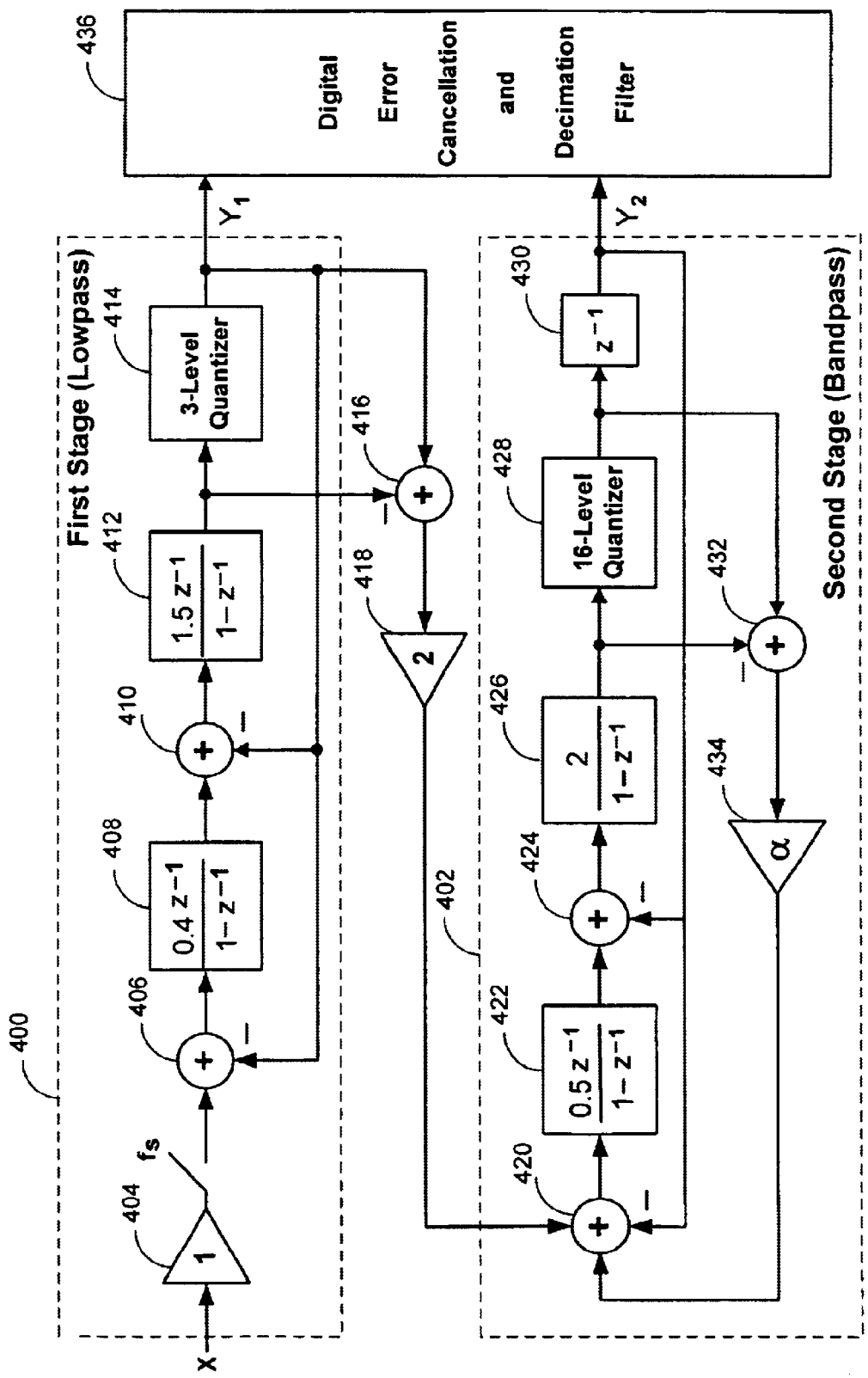
FIG. 4 is a block diagram illustrating the details of a sigma delta modulator embodiment according to the present invention.

FIG. 4 is a block diagram illustrating the details of a sigma delta modulator embodiment according to the present invention. In this embodiment, the oversampling ratio is 4. In other embodiments, other oversampling ratios may be used based on the modulator's dynamic range requirement. The coefficients and values in the circuitry also vary in other embodiments. The values for amplifier gain are non-zero values and also vary in different implementations.

Block 400 is the first modulator stage, also known as the lowpass modulator. Amplifier 404 is a buffer for the input to the sigma delta modulator. Combiner 406 subtracts the feedback from the output of the first modulator stage from the amplified input, and feeds the result to a first integrator stage 408. The integrator integrates its input over time. Combiner 410 subtracts the first stage modulator output from the integrator, and feeds the result to a second integrator stage 412. The integration result is sent to a 3-level quantizer 414 to be quantized.

The difference between the input and the output of quantizer 414 is the quantization error of the first modulator stage, which is computed by combiner 416. The quantization error is amplified by amplifier 418, and then fed to another combiner 420 at the input of the second modulator stage. Block 402 is the second modulator stage, also known as the bandpass modulator. The second modulator stage measures the quantization error introduced by the first modulator stage, and does additional noise shaping. In this stage, the output of combiner 420 is sent to integrator 422. Combiner 424 subtracts the feedback from the output of the second modulator stage from the output of integrator 422, and sends the result to integrator 426. The output from integrator 426 is sent to a 16-level quantizer 428 to be quantized. The quantized value is sent through a delay stage 430, and the delayed value is fed back and subtracted by combiner 420. The quantization error is computed by combiner 432, sent to an amplifier 434 that has an adjustable gain α, and then fed back to combiner 420 at the input of the second stage.

The inputs to digital error cancellation and decimation processor 436 are the output from the first modulator stage and the output from the second modulator stage. The output from the first stage includes information about the input signal and the first stage quantization error. The output from the second stage includes information about the estimated value of the first stage quantization error and a second stage quantization error. Based on known transfer characteristics about the two stages, filter 436 is designed to cancel the first stage quantization error. Due to the additional noise shaping and multi-bit quantization in the second stage, the effect of the second stage quantization error is greatly attenuated. Thus, the output of the SDM has relatively low error rate.

In this embodiment, the quantizer in the first modulator stage is chosen to be a 3-level quantizer for better linearity during the digital to analog conversion. Because of the noise shaping in the first stage, the linearity requirement for the second stage is relaxed and allows the use of low power quantizer with more levels in the second stage. In this embodiment, the quantizer used in the second modulator stage is a 16-level quantizer. In different embodiments, the numbers of levels in the quantizers may vary.

In the second modulator stage, the feedback loop with a gain of α provides noise shaping by creating a minimum in the NTF that is offset from DC. The NTF is influenced by the circuit topology, therefore the location of the minimum is determined by the gain α. In this embodiment, the gain can be adjusted by resetting the value for α, and therefore the location of the minimum as well as the NTF of the system are adjustable, too. In other embodiments, there may be more modulator stages with feedback loops to provide other minima that are also offset from DC, to reduce noise at different frequency bands.

An improved sigma delta modulator design has been disclosed. The design cascades a number of modulator stages and uses feedback techniques to provide better and more flexible noise shaping. The resulting SDM supports lower oversampling ratio and consumes less power.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A sigma delta modulator comprising:
    a first modulator stage configured to provide a first modulator stage output; and
    a second modulator stage coupled to the first modulator stage;
    wherein:
        the first modulator stage output is sent to the second modulator stage;
        the first modulator stage output includes a quantization error;
        the first modulator stage comprises a lowpass modulator; and
        the second modulator stage comprises a bandpass modulator.

2. A sigma delta modulator as recited in claim 1, wherein the quantization error is caused by a quantizer included in the first modulator stage.

3. A sigma delta modulator as recited in claim 1 wherein the sigma delta modulator has a noise transfer function having a plurality of minima.

4. A sigma delta modulator as recited in claim 1 wherein:
    the sigma delta modulator has a noise transfer function having a plurality of minima; and
    at least one of the plurality of minima is offset from direct current.

5. A sigma delta modulator as recited in claim 1, wherein the second modulator stage is configured to measure the quantization error.

6. A sigma delta modulator as recited in claim 1, wherein the second modulator stage is configured to measure the quantization error and estimate the quantization error.

7. A sigma delta modulator as recited in claim 1, further comprising an error cancellation stage configured to obtain a modulator output based on the first modulator stage output and the second modulator stage output.

8. A sigma delta modulator as recited in claim 1 wherein the first modulator stage and the second modulator stage are in a cascaded configuration.

9. A sigma delta modulator as recited in claim 1, wherein the second modulator stage includes a feedback loop having a gain and the feedback loop provides noise shaping.

10. A sigma delta modulator as recited in claim 1, wherein the second modulator stage includes a feedback loop having a gain and the feedback loop provides noise shaping by having a noise transfer function with a minimum that is offset from direct current.

11. A sigma delta modulator as recited in claim 1 wherein the plurality of modulator stages comprises a first modulator stage and a second modulator stage wherein:

the first modulator stage comprises a first quantizer; and the second modulator stage comprises a second quantizer that has more levels than the first quantizer.

12. A sigma delta modulator as recited in claim 1 wherein:

the first modulator stage comprises a 3-level quantizer; and the second modulator stage comprises a 16-level quantizer.

13. A sigma delta modulator as recited in claim 1 wherein the sigma delta modulator has an oversampling ratio of 4.

14. A sigma delta modulator as recited in claim 1 wherein the sigma delta modulator is a wideband sigma delta modulator.

15. A sigma delta modulator as recited in claim 1 wherein the sigma delta modulator is a wideband sigma delta modulator used in wireless local area network devices.

16. A sigma delta modulator as recited in claim 1 further comprising a buffer for an input to the sigma delta modulator.

17. A sigma delta modulator as recited in claim 1, wherein the second modulator stage includes a feedback loop having a gain and the feedback loop provides bandpass noise shaping.

18. A method for reducing noise in a sigma delta modulator comprising:

inputting a signal to a first modulator stage; and providing a first modulator stage output by a first modulator stage to a second modulator stage;

wherein:

the first modulator stage output includes a quantization error;

the first modulator stage comprises a lowpass modulator; and the second modulator stage comprises a bandpass modulator.

19. A method for reducing noise in a sigma delta modulator as recited in claim 18 wherein the sigma delta modulator has a noise transfer function having a plurality of minima.

20. A method for reducing noise in a sigma delta modulator as recited in claim 18 wherein:

the sigma delta modulator has a noise transfer function having a plurality of minima; and at least one of the plurality of minima is offset from direct current.

21. A method for reducing noise in a sigma delta modulator as recited in claim 18 further comprising buffering an input to the sigma delta modulator.

22. A method for reducing noise in a sigma delta modulator as recited in claim 18 wherein the sigma delta modulator is a wideband sigma delta modulator used in wireless local area network devices.

23. A method for reducing noise in a sigma delta modulator as recited in claim 18 wherein the sigma delta modulator is a wideband sigma delta modulator.

24. A method for reducing noise in a sigma delta modulator as recited in claim 18 wherein the plurality of modulator stages is in a cascaded configuration.

25. A method for reducing noise in a sigma delta modulator as recited in claim 18 wherein the sigma delta modulator has an oversampling ratio of 4.

26. A method for reducing noise in a sigma delta modulator as recited in claim 18 wherein:

the first modulator stage comprises a 3-level quantizer; and the second modulator stage comprises a 16-level quantizer.

27. A method for reducing noise in a sigma delta modulator as recited in claim 18 wherein:

the first modulator stage comprises a first quantizer; and the second modulator stage comprises a second quantizer that has more levels than the first quantizer.

28. A sigma delta modulator comprising:

a first modulator stage configured to provide a first modulator stage output; and a second modulator stage coupled to the first modulator stage;

wherein:

the first modulator stage output is sent to the second modulator stage;

the first modulator stage output includes a quantization error;

the second modulator stage includes a feedback loop having a gain;

the feedback loop provides noise shaping by having a noise transfer function with a minimum that is offset from direct current; and the location of the minimum is adjustable by changing the gain.

* * * * *